United States Patent
Kleveland et al.

(10) Patent No.: US 6,781,878 B2
(45) Date of Patent: Aug. 24, 2004

(54) DYNAMIC SUB-ARRAY GROUP SELECTION SCHEME

(75) Inventors: Bendik Kleveland, Santa Clara, CA (US); Roy E. Scheuerlein, Cupertino, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/217,182

(22) Filed: Aug. 12, 2002

(65) Prior Publication Data

US 2004/0027855 A1 Feb. 12, 2004

(51) Int. Cl.[7] .................... G11C 16/04; G11C 16/06
(52) U.S. Cl. ................ 365/185.11; 365/185.21; 365/185.29
(58) Field of Search .................. 365/185.11, 185.2, 365/185.21, 185.29, 185.33

(56) References Cited

U.S. PATENT DOCUMENTS

| | | | |
|---|---|---|---|
| 4,698,788 A | | 10/1987 | Flannagan et al. |
| 5,276,649 A | | 1/1994 | Hoshita et al. |
| 5,953,255 A | * | 9/1999 | Lee ..................... 365/185.29 |
| 5,991,197 A | * | 11/1999 | Ogura et al. ........... 365/185.11 |
| 6,134,143 A | * | 10/2000 | Norman ................ 365/185.33 |
| 6,212,121 B1 | | 4/2001 | Ryu et al. |
| 6,504,778 B1 | * | 1/2003 | Uekubo .................. 365/185.2 |
| 6,515,905 B2 | * | 2/2003 | Hikida ................... 365/185.2 |
| 6,525,963 B2 | * | 2/2003 | Kern et al. ............. 365/185.2 |
| 6,574,146 B2 | * | 6/2003 | Micheloni et al. ...... 365/185.2 |

* cited by examiner

Primary Examiner—Trong Phan
(74) Attorney, Agent, or Firm—Pamela J. Squyres

(57) ABSTRACT

A method of selecting numbers of sub-array groups for simultaneous operation to optimize bandwidth biases a number of sub-array groups and compares a circuit state value, preferably voltage, to a reference parameter to determine if the operation can successfully be preformed for that number of sub-array groups. The comparison may be repeated with ifferent numbers of sub-array groups biased to find the optimum number of sub-array groups for the operation.

24 Claims, 8 Drawing Sheets

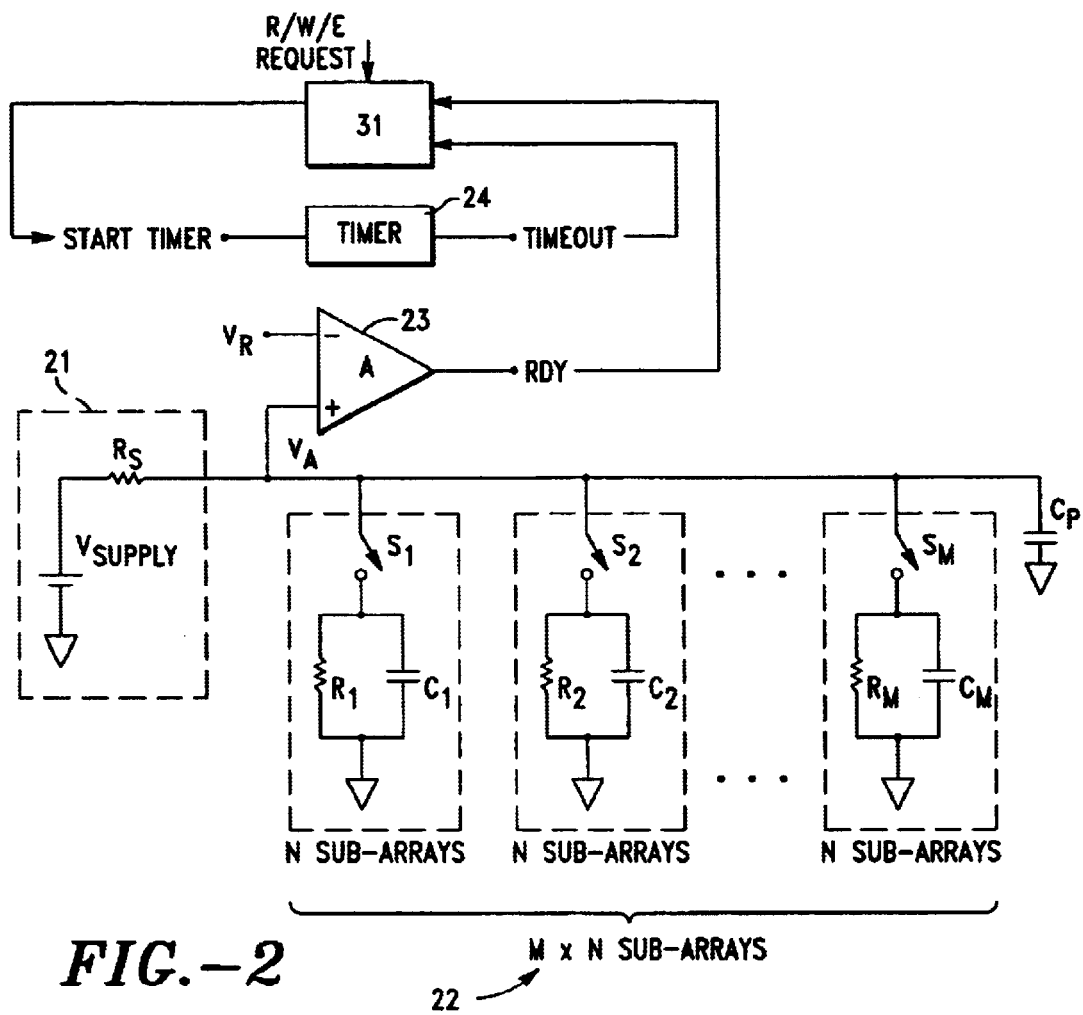
*FIG.−2*
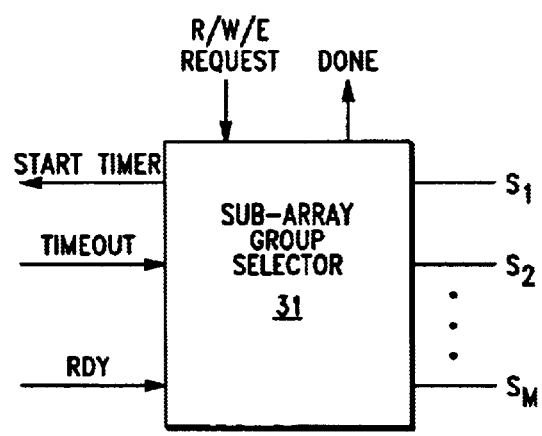
*FIG.−3*

FIG.—6

DYNAMIC SUB-ARRAY GROUP SELECTION SCHEME

BACKGROUND OF THE INVENTION

Passive element memory arrays, such as antifuse diode cell arrays, require a high-voltage and high-current programming voltage source due to the large number of leakage paths in the array and the high voltage required to program the memory. The write power increases the temperature of the memory cells. As the temperature of the memory cell diodes increases, the diode leakage current increases. Increased leakage may cause a drop in voltage available to program memory, and may result in incomplete or unreliable programming.

There is a need to maximize the bandwidth of read, write, and erase operations while avoiding incomplete or unreliable programming.

SUMMARY OF THE INVENTION

The present invention is defined by the following claims, and nothing in this section should be taken as a limitation on those claims. In general, the invention is directed to a direct method of selecting the optimal number of sections for simultaneous write, read, or (in the case of rewriteable memory) erase operations based on actual, rather than projected, conditions on the circuit.

The preferred embodiments described below provide for a method of selecting a number of sections to concurrently read, write, or erase. The number is based on a direct measurement of a condition of the circuit. One preferred embodiment involves biasing a test number of sections, and obtaining a circuit state value, which is responsive to the number of sections biased. The method then involves comparing the circuit state value to a reference parameter. Finally, a number of sections to write, read, or erase is selected based on the result of the comparison. In another preferred embodiment, the process of biasing sections, comparing a circuit state value with a reference parameter, and selecting a number of sections to write, read, or erase can be repeated, with a different number of sections biased for each repetition.

Another preferred embodiment provides for a memory device employing a method of selecting a number of sections to concurrently read, write, or erase. The number is based on a direct measurement of a condition of the circuit. One preferred embodiment provides for a memory device employing a method which involves biasing a test number of sections, and obtaining a circuit state value, which is responsive to the number of sections biased. The method then involves comparing the circuit state value to a reference parameter. Finally, a number of sections to write, read, or erase is selected based on the result of the comparison. In another preferred embodiment, the process of biasing sections, comparing a circuit state value with a reference parameter, and selecting a number of sections to write, read, or erase can be repeated, with a different number of sections biased for each repetition.

Other preferred embodiments are provided, and each of the preferred embodiments can be used alone or in combination with one another.

The preferred embodiments will now be described with reference to the attached drawings.

BRIEF DESCRIPTION OF THE DRAWINGS

FIG. 2 is a circuit diagram of a power supply and sub-array groups, and the sub-array group selector with its inputs and outputs.

FIG. 3 is an illustration of the input and output of a sub-array group selector.

DETAILED DESCRWHON OF THE INVENTION

Memories are often divided into sections. A section of a memory can be called by different names, such as array, sub-array, sub-array group, or segment, and such sections may be grouped together into larger groupings or may include further divisions, or both. Different manufacturers will use these terms differently. It will be understood that the terms "group of sub-arrays" and "sub-array group" as used throughout this specification refer to an independently addressable section of memory.

Existing methods to avoid programmning with insufficient voltage limit programming operations based on projected or calculated conditions. There will be random and systematic differences in fabrication from chip to chip, and there may be significant temperature gradients across the array. Such variation means that schemes based on indirect measures will necessarily be based on worst-case assumptions about the memory array leakage, and will likely result in the device operating at a bandwidth below its actual capacity most of the time. It is an object of the present invention to maximize bandwidth based on actual, rather than theoretical, conditions.

The apparatus and methods of dynamic sub-array group selection described here can be used in a memory array divided into groups of sub-arrays where such groups can be written, read, or erased together, singly, or in any combination. Such a memory array divided into selectable groups of sub-arrays is described in more detail in "Memory Device and Method for Selectable Sub-Array Activation," by Roy E. Scheuerlein and Bendik Kleveland, U.S. patent application Ser. No. 09/943655, which is assigned to the assignee of the present invention and is hereby incorporated by reference. A memory array divided into groups of sub-arrays is shown in FIG. 1.

Figure 1:
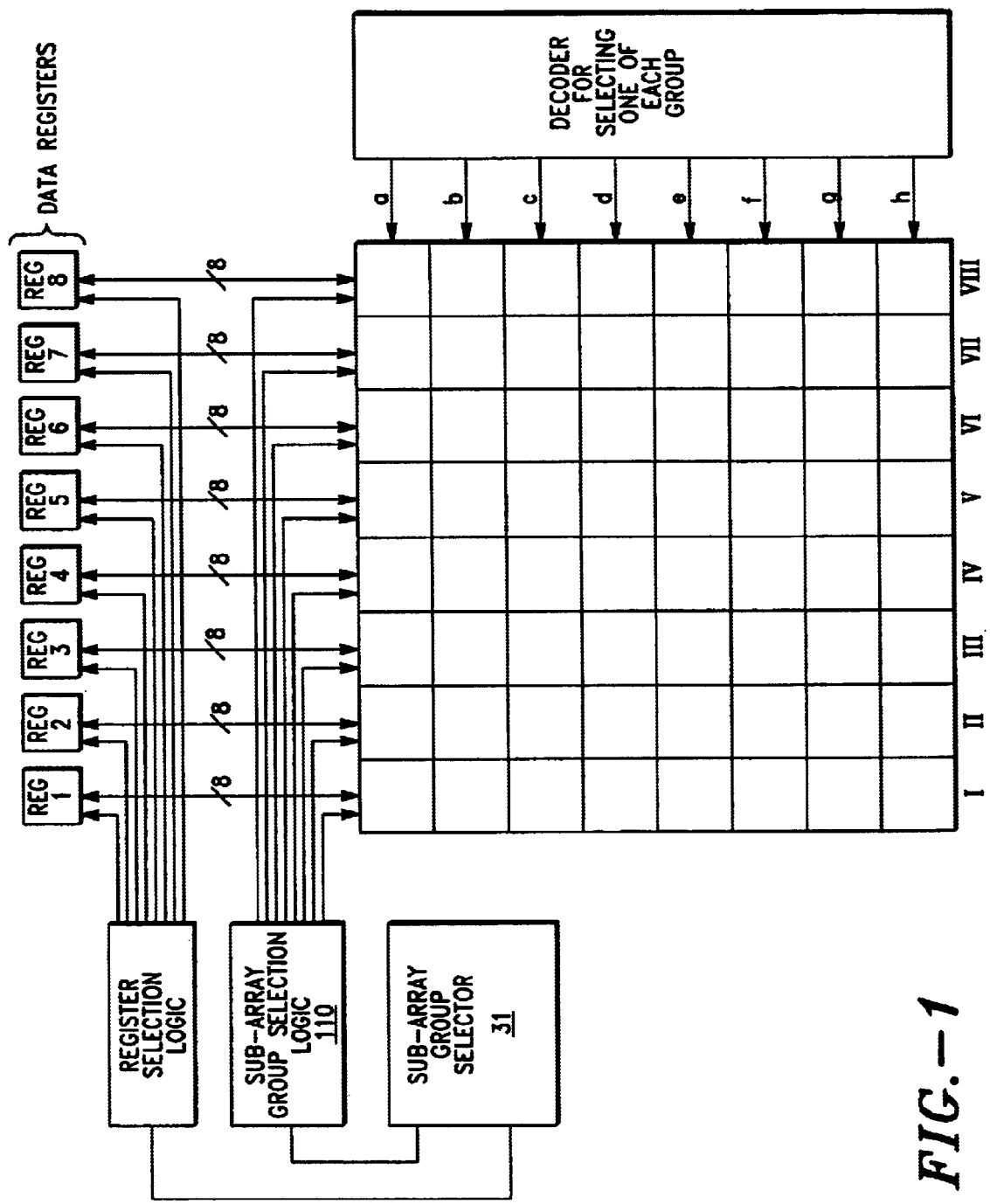
FIG. 1 is an illustration of a memory array divided into selectable sub-array groups.

As shown in FIG. 1, the memory array of Scheucrlein et al. is divided into 64 sub-arrays (a–h) organized into eight groups (Groups I–VIII). Each sub-array group is coupled with sub-array group selection logic 110, and each row of sub-arrays is coupled with a decoder (DECODER), shown to the right of Groups I–VIII. Each sub-array group is connected to a respective one of eight data registers (REG 1 through REG 8) via a byte-wide data bus. The eight data registers are connected with register selection logic (REGISTER SELECTION LOGIC), shown above subarray group selection logic 110.

The subarray groups can be selected for a write, read, or erase operation. When an explanation may apply to any of these, a write, read, or erase operation will be referred to simply as an operation.

In the description that follows, a number of sub-array groups will be selected based on a circuit state value. This circuit state value can be voltage, a current, or any other property that is responsive to the number of sub-array groups biased and can be tested to determine if an operation can be successfully performed. Most of the examples that follow describe testing a voltage, but it will be clear to those skilled in the art that the circuit state value need not be a voltage, but may be a current or some other property instead.

It is useful to first identify a target circuit state value, for example a target voltage, $V_{TARGET}$, or reading and for writing. Typically $V_{TARGET}$ will have a different value for reading, for writing, and for erasing. Such a value, whether a voltage or some other property, is an optimum value which, when used for an operation, guarantees that it will be performed successfully. This value will normally be a known characteristic of the memory. Success would normally include a guarantee that the results of the read, write, or erase are fully predictable and reliable. If, for example, a write-once antifuse diode memory cell is programmed at a voltage less than $V_{TARGET}$, the antifuse can be only partially blown, such that its value is unpredictable when read. $V_{TARGET}$ will normally be substantially larger for a write than for a read.

FIG. 2 shows a circuit diagram of a power supply 21 and sub-array groups 22. The power supply 21 can be, for example, a voltage source ( a current source, or a charge pump. Each sub-array group has a switch, here labeled $S_1$, $S_2$, through $S_M$. Biasing a sub-array group refers to closing its switch. A sub-array group must be biased before any operation can be performed on it. Such biasing can be done without actually performing a write, read, or erase operation. There is a comparator 23 which will compare the voltage on the circuit, $V_A$, to a reference parameter, in this case a reference voltage, $V_R$. $V_R$ will either be the same as the target voltage VTARGrEr or should be derived from it, as will be described below. A timer 24 is also provided, as is the sub-array group selector 31.

The leakage of each sub-affay group is represented by the effective resistance, $R_N$ (for example $R_1$, $R_2$, through $R_M$ in FIG. 2.) $R_N$ will depend on temperature and process variations in the memory, and thus may vary over time and from one sub-array group to the next. Each sub-array group will also have a parasitic capacitance, $C_N$ (for example $C_1$, $C_2$ through $C_M$, in FIG. 2), that will affect the charge and discharge of the node $V_A$.

The dynamic selection of sub-array groups is controlled by sub-array group selector 31, shown in FIG. 3. The sub-array group selector is a simple finite state machine that can be implemented using conventional logic gates and storage elements such as latches or flip-flops.

Referring to FIGS. 2 and 3, when the sub-array group selector 31 receives a read/write/erase request, one or more sub-array groups are biased, and a timer 24 is started (as indicated by label START TIMER). When one or more sub-array groups are biased by closing their switches ($S_1$ through $S_M$), the voltage on the biased sub-array groups, $V_A$, drops suddenly, then settles at a new voltage within a calculable period of time. The timer 24 begins counting toward a timeout period, which is at least as long as the settling time. $V_A$ and a reference voltage, $V_R$, are input to a comparator 23. If $V_A$ reaches $V_R$ before the timeout period ends, the comparator produces a ready signal, RDY, which, as shown in FIG. 3, is input to the sub-array group selector 31, and the timer is stopped. If $V_A$ doesn't reach $V_R$ before the timeout period ends, the TIMEOUT signal is input to the sub-array group selector 31 instead.

The TIMEOUT and RDY signals may be synchronized to the control logic clock, which may or may not be the same as the clock used for the timer. Alternative methods are to use Set/Reset latches or asynchronous handshakes between the control and the blocks generating the TIMEOUT and RDY signals.

A TIMEOUT signal is an indication that the operation cannot be successfully performed for the number of sub-array groups biased. Conversely, a RDY signal is an indication that the operation can be successfully performed for the number of sub-array groups biased. When the selection is done (DONE). This information can be used to select the number of sub-array groups on which to operate.

Figure 4:
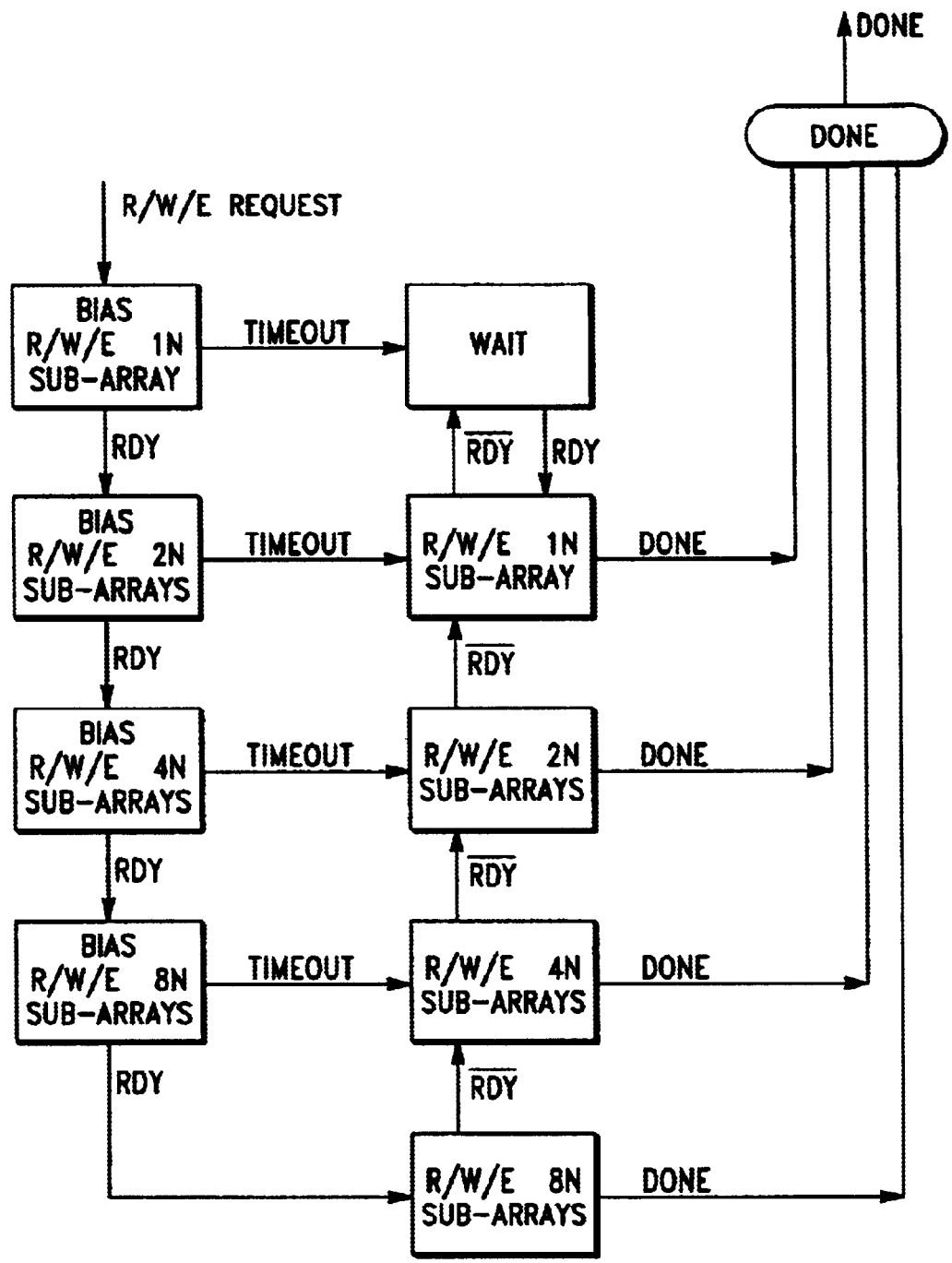
FIG. 4 is a flow chart illustrating iterative selection of a number of groups of sub-arrays to read, write, or erase with the number of sub-array groups biased increased on each iteration.

FIG. 4 illustrates one embodiment, a scheme for iterating to find an optimum number of sub-array groups on which to operate, increasing the number of sub-array groups biased for each iteration. Four test numbers are preselected for test. In this example, the four test numbers are 1, 2, 4, and 8, though it will be apparent to one skilled in the art that these test numbers are merely representative; other test numbers, and more or fewer test numbers, could be used instead.

According to this embodiment, in response to a read/write/erase request, the number 1 is the first test number, so one sub-array group is biased. If $V_A$ reaches $V_R$ before the timeout period ends, the sub-array group selector receives a RDY signal. (The case in which $V_A$ fails to reach $V_R$ before the timeout period ends and a TIMEOUT signal is received when one sub-array group is biased is discussed below.) Moving to the next test number, two sub-array groups are biased, and the timer is restarted. The sub-array group selector will receive either a RDY signal, if $V_A$ reached $V_R$ within the timeout period, or a TIMEOUT signal, if $V_A$ failed to reach $V_R$ within the timeout period. If it receives a TIMEOUT signal, then only one sub-array group can be written under current conditions. If it receives a RDY signal, the sub-array group selector moves to the next test number, four sub-array groups are biased, the timer is restarted, and so on.

To generalize, in this scheme, a RDY signal is an indication that the operation could successfully be performed on the number of sub-array groups currently biased, and the sub-array group selector moves on to try the next higher number. Conversely, a TIMEOUT signal is an indication that the operation cannot be successfully performed on the number of sub-array groups currently biased, and the number of sub-array groups biased in the previous attempt is the number of sub-array groups selected for the operation. The selection is done (DONE).

Edge cases require special handling. If a TIMEOUT signal is received when one sub-array group, the minimum number, is biased, indicating that the operation cannot be successfully performed, there are several possible responses. The sub-array group selector could enter a wait state for a longer time period, perhaps a millisecond, or, for some applications, perhaps a second, several seconds, or even longer, then try again, by which time conditions may have changed. If the failure was due to high leakage caused by high temperature, the temperature may have dropped in this time. In the case in which the memory array is employed in a camera, the failure may have been caused by a voltage drop as the flash recharged; once the recharge is complete, the sub-array group selector can begin again.

The device may be designed such that the sub-array group selector may not begin bias attempts again until a measured temperature, either on-chip or off, reaches a predetermined level. After failure, the device may indicate to the user to take some action, such as changing a battery. Further, if the smallest number of sub-array groups biased was larger than the actual physical minimum, that number could be further reduced. One skilled in the art will appreciate that the examples given here are only examples, and many different responses are possible, depending on the anticipated conditions and manner of use of the device.

To address the other edge condition, if a RDY signal is received when the maximum number of sub-array groups is biased, in this example eight sub-array groups, then eight sub-array groups can be selected for the operation.

Figure 5:
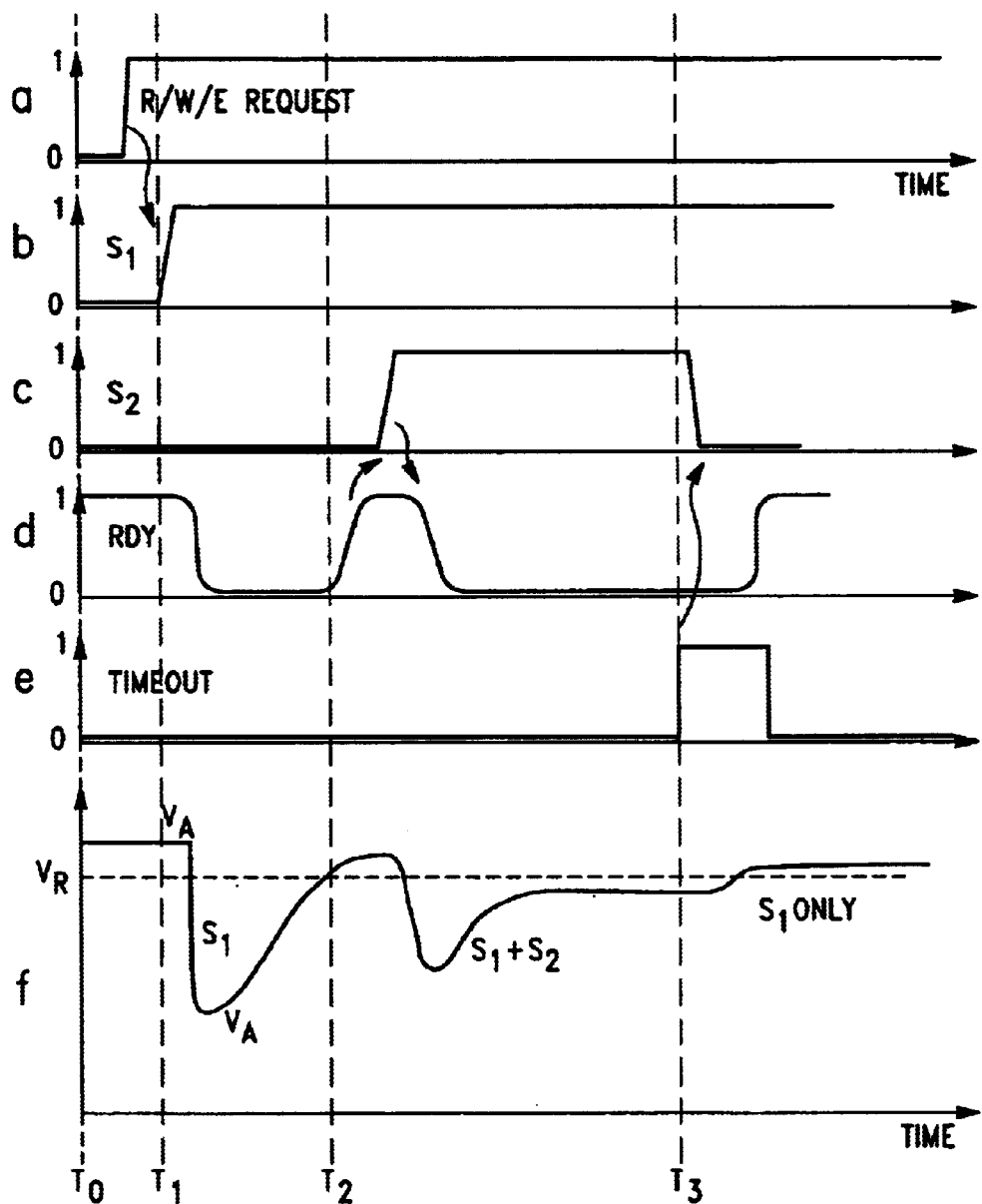
FIG. 5 is a timing diagram illustrating signals during a bias and test of first one, then two sub-array groups.

The actual signals generated using this scheme are shown in the timing diagram of FIG. 5. This diagram illustrates signals as first one, then two sub-array groups are biased. Initially, at $T_0$, with no sub-array groups biased, the RDY signal (graph d) is high, and all switches, $S_1$ (graph b), $S_2$ (graph c), etc, are open. A read/write/erase request is received and the R/W/E signal (graph a) goes high. In response at $T_1$, $S_1$ (graph b) is closed and the timer is started.

When $S_1$ (graph b) is closed, $V_A$ drops below $V_R$ (graph f) and the RDY signal (graph d) goes low. In this example, at $T_2$, $V_A$ reaches $V_R$ (graph f) and the RDY signal (graph d) goes high. In response, the sub-array group selector biases a second sub-array group, $S_2$ (graph c), and restarts the timer. $V_A$ drops again (graph f), and the RDY signal (graph d) goes low again. $V_A$ does not reach $V_R$ (graph f), and the timeout period is reached at $T_3$. The TIMEOUT signal (graph e) goes high. $S_2$ is opened (graph c), causing $V_A$ to rise above $V_R$ (graph f) and the RDY signal (graph d) to go high. Only one sub-array group is selected for the operation.

Figure 6:
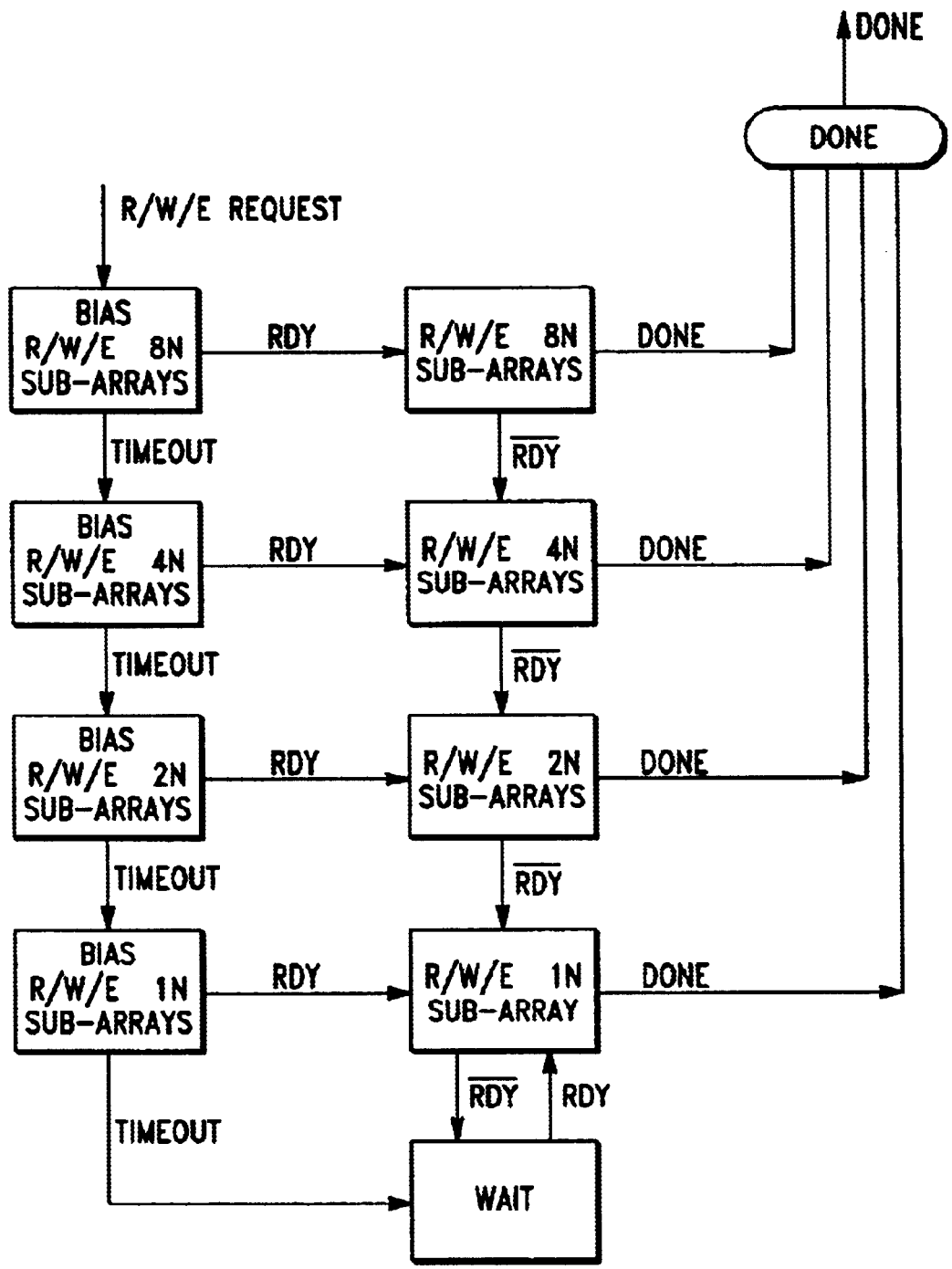
FIG. 6 is flow chart illustrating iterative selection of a number of groups of sub-arrays to read, write, or erase with the number of sub-array groups biased decreased on each iteration.

In another preferred embodiment, shown in FIG. 6, the number of sub-array groups biased on successive attempts is decreased on each iteration. Four test numbers are preselected for test. In this example, the four test numbers are 8, 4, 2, and 1, though it will be apparent to one skilled in the art that these test numbers are merely representative; other test numbers, and more or fewer test numbers, could be used.

In response to a read/write/erase request, the first test number of sub-array groups, eight, are biased. If $V_A$ reaches $V_R$ before the timeout period elapses, the subarray group selector receives a RDY signal, and eight sub-array groups are selected for the operation.

If instead $V_A$ does not reach $V_R$ before the timeout period elapses, a TIMEOUT signal is received. Moving to the next test number, four sub-array groups are biased, and the timer is restarted. The sub-array group selector will receive either a RDY signal, if $V_A$ reaches $V_R$ within the timeout period, or a TIMEOUT signal, if $V_A$ fails to reach $V_R$ within the timeout period. If it receives a RDY signal, four sub-array groups are selected for the operation. If it receives a TIME-OUT signal, the next test number is selected, two sub-array groups are biased, and so on.

To generalize, in this scheme, a RDY signal is an indication that the operation could successfully be performed on the number of sub-array groups currently biased, and that number of sub-array groups is selected for the operation. Conversely, a TIMEOUT signal is an indication that the operation cannot be successfully performed on the number of sub-array groups currently biased, application Ser. No. 10/217,182 3 and th sub-array group selector moves on to try a smaller number of sub-array groups. The slection is done(DONE).

In this scheme, there is one edge condition that requires special handling. If $V_A$ fails to reach $V_R$ when the smallest number of sub-array groups (one, in this example) is biased, the operation cannot be performed on that number. There can be a variety of responses to this condition, as described earlier.

Figure 7:
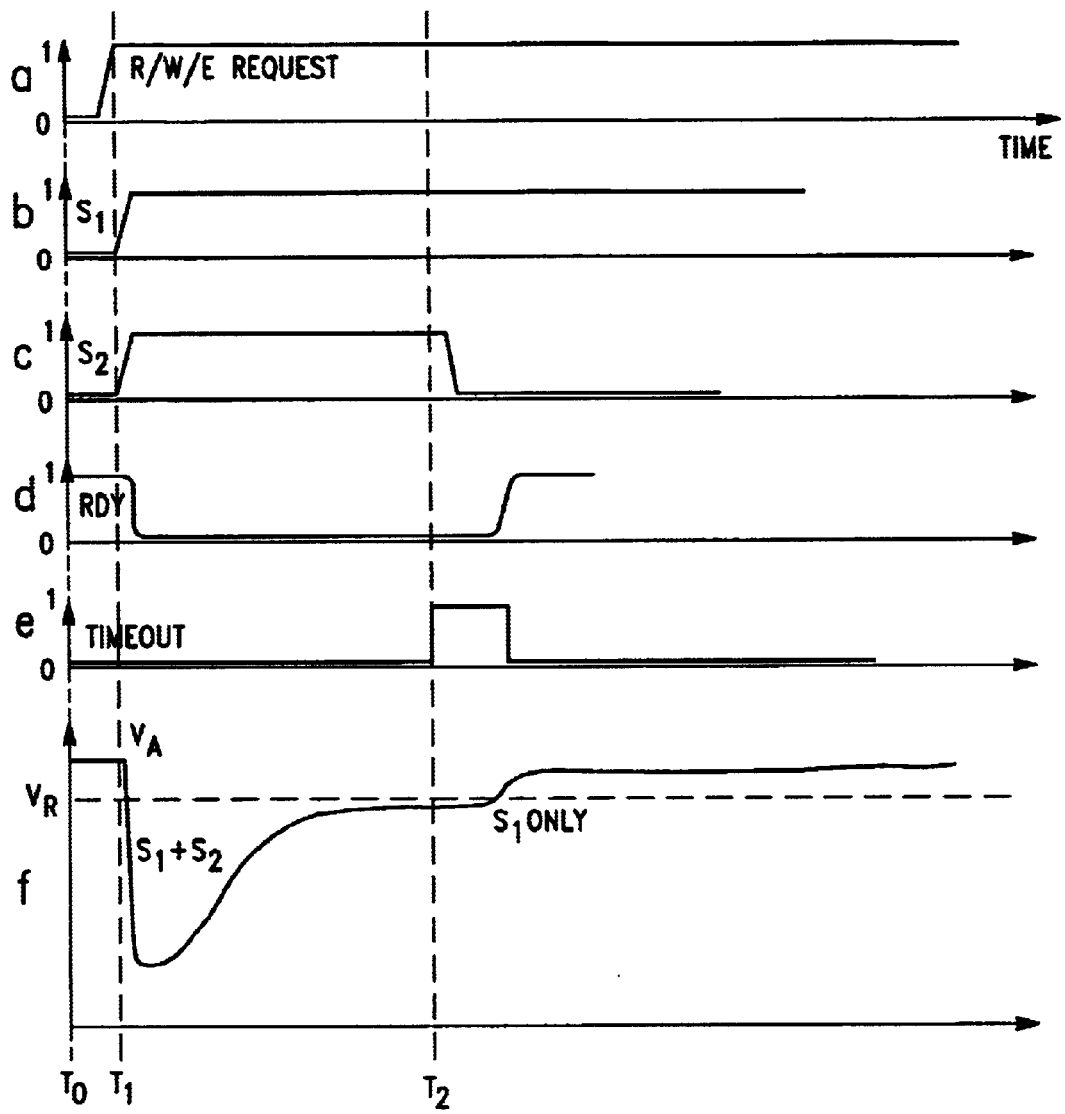
FIG. 7 is a timing diagram illustrating signals during a bias and test of first two, then one sub-array groups.

The signals generated using this scheme are shown in the timing diagram of FIG. 7. This diagram illustrates signals as first two sub-array groups, then one is biased. Initially, at $T_0$, with no sub-array groups biased, the RDY signal (graph d) is high, and all switches, $S_1$ (graph b), $S_2$ (graph c), etc, are open. A read/write/erase request is received and the R/W/E signal (graph a) goes high. In response at $T_1$, $S_1$ (graph b) and $S_2$ (graph c) are closed and the timer is started.

When $S_1$ (graph b) and $S_2$ (graph c) are closed, $V_A$ drops below $V_R$ (graph f) and the RDY signal (graph d) goes low. In this example, $V_A$ does not reach $V_R$ (graph f) during the timeout period, and at $T_2$ the timeout period is reached and the TIMEOUT signal (graph e) goes high. In response, $S_2$ (graph c) is opened and $V_A$ rises above $V_R$ (graph f). The RDY signal (graph d) goes high, and one sub-array group is selected for the operation.

A corner condition can occur when a number of sub-array groups is biased, the circuit state value reaches the reference parameter, an operation is initiated, then the circuit state value drops below the reference parameter before the operation is complete. Conditions causing leakage, like temperature, are relatively slow-changing, so this condition, while possible, is unlikely.

Figure 8:
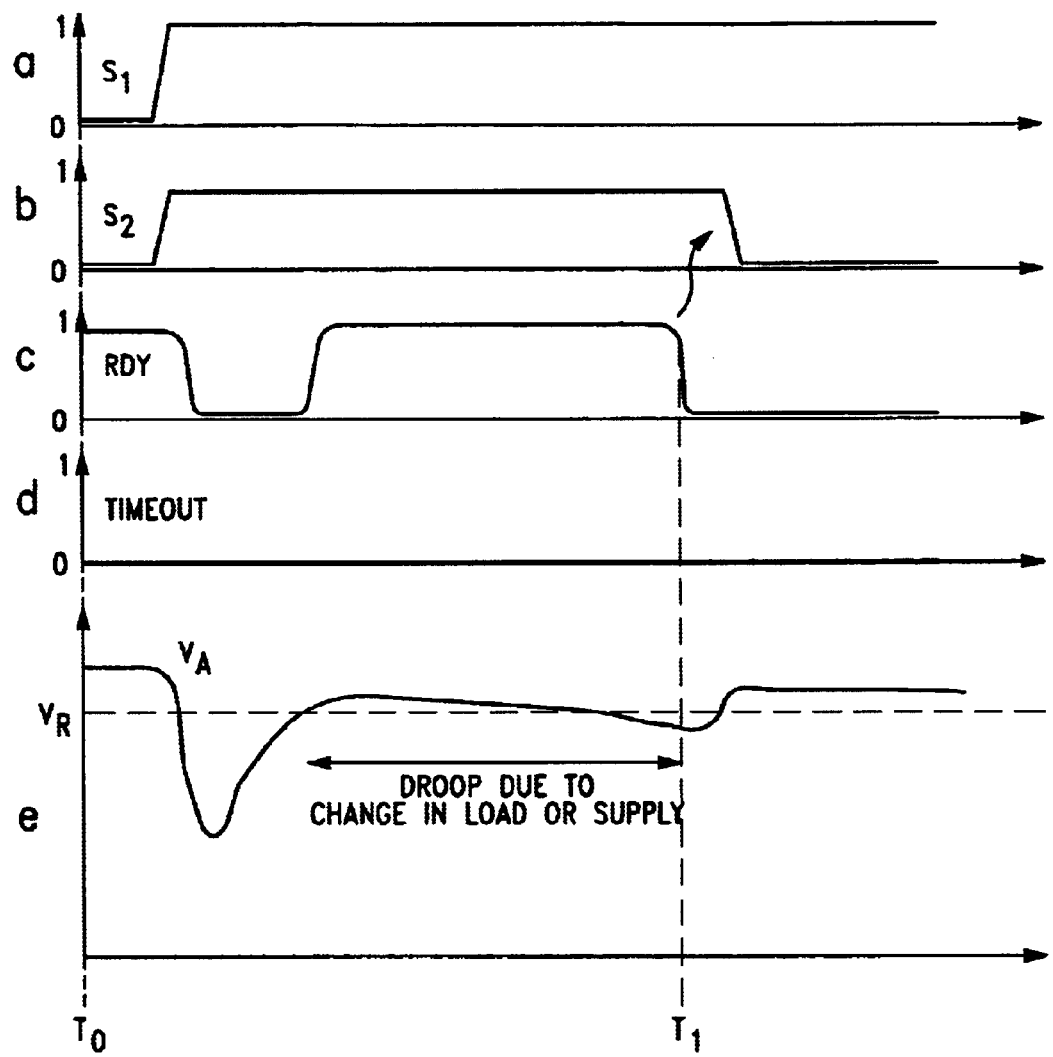
FIG. 8 is a timing diagram illustrating signals when the circuit state value drops below the reference parameter before the operation is complete.

One possible response to this situation is shown in FIG. 8. If $V_A$ drops below $V_R$, the RDY signal goes low, as at $T_1$. In response, as shown, the operation can be interrupted and continued with fewer sub-array groups. Alternatively, the operation can be allowed to finish and a new operation on the same number of sub-array groups can be prevented from starting.

Figure 9:
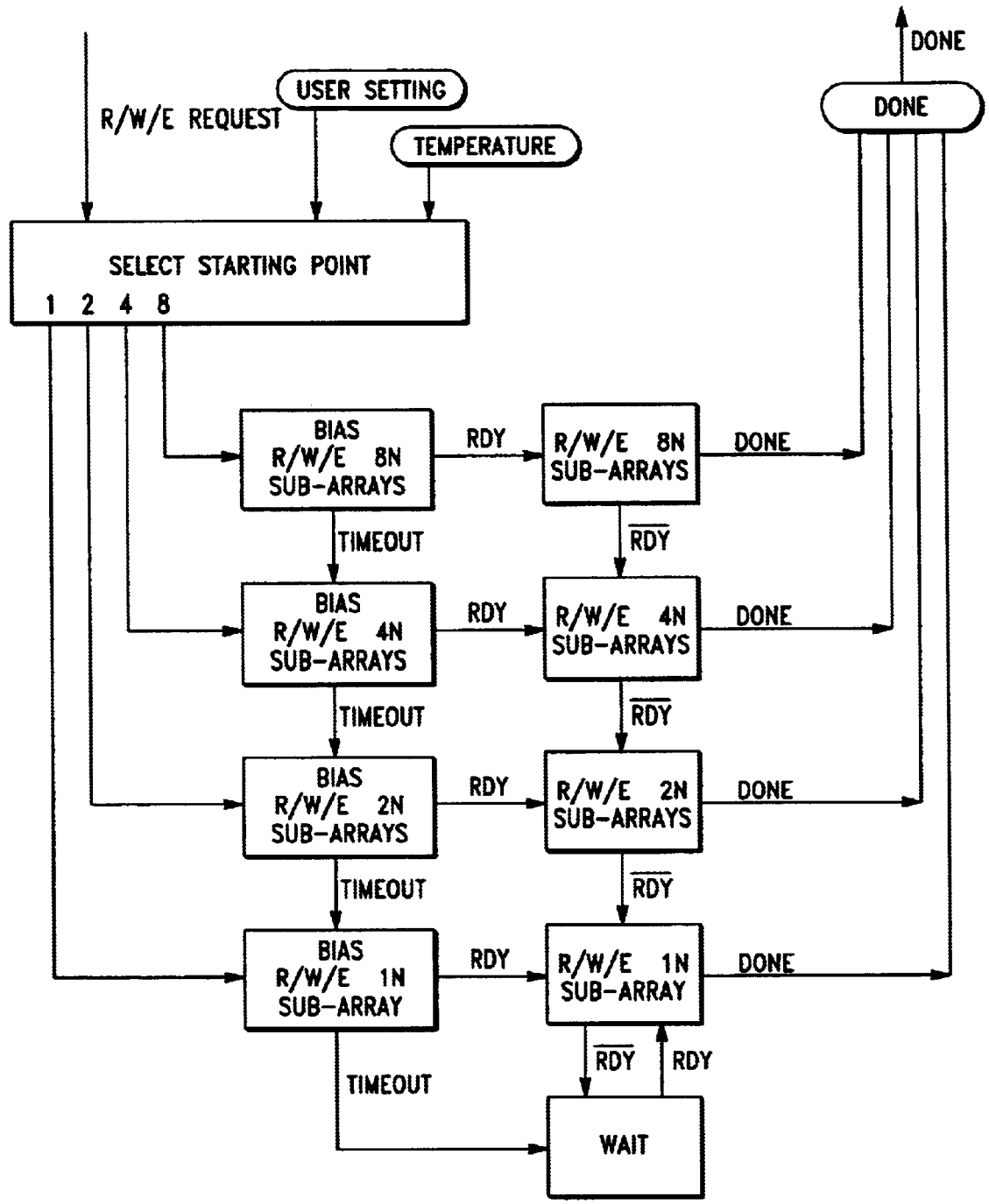
FIG. 9 is a flow chart illustrating the selection of the starting point for iteration based on environmental factors.

Many other possible variations on the scheme described here are possible. The first number of sub-array groups to be biased can be varied (as shown by the box labeled SELECT STARTING POINT) depending on outside factors (environmental values indicating a condition of the memory device). One example of such a factor is temperature (TEMPERATURE), either on-chip or elswhere in the device. This is illustrated in FIG. 9. In this example, the number of sub-array groups biased in successive attempts is decreased. If the temperature is high, the starting point can be the second, third, fourth test number, rather than the first. Similarly, the starting point can be changed in response to a user setting (USER SETTING: a battery-saving setting, for example.) The numbers of sub-array groups tested can be changed (to, say, 8, 6, 4, and 2, for example) as well, or instead.

The starting point, or the values tested, can be changed depending on the results of past comparisons. If, for example, on repeated read/write/erase requests it is discovered that eight sub-array groups can never be operated on and the largest successful number is consistently four, the numbers tested could be changed from 8, 4, 2, and 1 to 4,3, 2, and 1.

The techniques of changing the starting value, or the values tested, based on conditions or on past results can be used together, separately, or alternately.

The timeout period should be long enough for the circuit state value, for example the voltage, to restabilize after any combination of the switches, $S_1$ through $S_M$, are closed to bias the sub-array groups. If the circuit state value is a voltage, when one switch is closed, the time required for $V_A$ to settle at a new voltage is approximately:

$$[(R_S \times R)/(R_S+R)] \times [C + C + C_P]$$

R is the expected resistance across a sub-array group, and C is the expected capacitance across a sub-array group. Referring to FIG. 2, $R_S$ is the resistance across the power supply 21 and $C_P$ is the parasitic capacitance of $V_A$.

Similarly, when two switches are closed, the time required for the $V_A$ to settle is approximately:

$$[(R_S \times R)/(R_S+R)] \times [C + C + C_P]$$

A timeout period can be calculated for each number of subarray groups. Alternatively, in environments in which speed is less critical and the settling time is relatively short, it may be more convenient to always use the maximum timeout period. If, for example, the settling time for one sub-array group is 20 nanoseconds and the settling time for eight sub-array groups is 90 nanoseconds, it may be a better choice to set the timeout period to a length of time guaranteed to be adequate for the worst case, perhaps 200 nanoseconds. If, on the other hand, the settling times are longer, for example if the settling time for one sub-array group is 2 microseconds and the settling time for eight sub-array groups is 9 microseconds, a different timeout period can be used to reflect the actual settling time for each number of sub-array groups.

Since the circuit state value is typically affected by factors that change relatively slowly, like battery voltage and temperature, it will not normally be necessary to perform the test before every operation. Testing can be performed every page or at some specified time interval instead, or can be triggered by some change in conditions.

In any event, testing is most preferably carried out at a time that is at least functionally proximate to the read, write, and/or erase operation. "Functionally proximate" in the most preferred embodiments means substantially immediately before the first operation in a series of operations; but also includes any time after manufacture.

Test numbers can be changed dynamically to any value, but management of read, write, and erase operations is simplest if the test numbers are even factors of the maximum number of subarray groups. For example, if the memory is divided into ten sub-array groups, the maximum number of sub-array groups that can be written at one time is ten. If five sub-array groups are written at a time instead, two writes will evenly complete the array. If two sub-array groups are written at a time, five writes will evenly complete the array. If only one sub-array group is written at a time, ten writes will evenly complete the array.

If, however, the choice is made to write three sub-array groups at a time, starting with the first sub-array group, after three operations nine sub-array groups will have been written, with one sub-array group remaining. The gain achieved by matching the possible bandwidth more closely may be outweighed by the extra work and logic required to keep track of these remainders.

If test numbers are limited to even factors of the physical maximum, the subarray group selector can choose between a finite number of states, which can be encoded in a few bits. Turning to FIG. 1, if there are four test numbers, for example, the sub-array group selector 31 can select between four states stored in two bits, which can be decoded by the sub-array group selection logic 110 to the actual test number for biasing and read/write/erase operations.

The reference parameter, as noted above, will be derived from a circuit state value, where the circuit state value can be voltage, current, or any other property that is responsive to the number of sub-array groups biased and can be testedto determine if an operation can be successfully performed. Voltage is a particularly convenient property to use for this purpose.

A reference voltage, $V_R$, can be derived from the target voltage, $V_{TARGET}$, described above. $V_R$ can be the same as $V_{TARGET}$, or may have a known relationship to it. It may be useful, for example, for $V_R$ to be the constant, known output of a band gap generator. Since the high voltage required for a write operation may not be readily available on the circuit, it can be most convenient to operate with a band gap generator with an output voltage, $V_R$, less than $V_{TARGET}$, the voltage required for a successful write operation. In this case $V_A$ can be input to a resistive divider at a ratio such that the output of the resistive divider provided for comparison with $V_R$ should be the same as $V_R$ if $V_A$ is the same as $V_{TARGET}$.

For example, suppose VTARGER is 10 volts, and $V_R$, the output of the band gap generator, is 1.25 volts. $V_A$ can be put through a resistive divider at a 8:1 ratio. If $V_A$ is 10, the output of the resistive divider will be 1.25 volts, which will be compared with $V_R$, also 1.25 volts.

If current is used for the circuit state value instead, it would be apparent to one skilled in the art that current can be similarly scaled, if convenient, using ratioed transistor current mirrors.

The apparatus and methods described here could be used with any type of memory, but due to the time required to bias sub-array groups and perform the comparisons, it is used to best effect with memory types and in applications in which latency is not critical. Examples of memory types with which it can beneficially be used are monolithic threeimensional memory arrays such as the write-once antifuse diode memory arrays of the type described in U.S. Pat. No. 6,034,882, "Vertically stacked field programmable nonvolatile memory and method of fabrication," by Johnson et al., in U.S. Pat. No. 6,420,215, "Three-dimensional memory array and method of fabrication," by Knall et al., in U.S. application Ser. No. 09/928536, filed Aug. 13, 2001, "Verticlly-stacked, field-programmable, nonvolatile memory and method of fabrication," by Johnson, or in U.S. application Ser. No. 10/185507, filed Jun. 27, 2002, "Electrically isolated pillars in active devices," by Vyvoda et al.; or in the monolithic three-dimensional rewriteable memory array described in U.S. application Ser. No. 09/927648, filed Aug. 13, 2001, "Dense arrays and charge storage devices, and methods for making same," by Lee et al.; all assigned to the assignee of the present invention. However, the apparatus and methods described here could also be used with conventional two-dimensional flash memory arrays.

What is claimed is:

1. A method for dynamically selecting within a memory device a quantity of sections of a memory to be activated for a read/write/erase operation comprising the steps of:

(a) biasing a number of sections to be read, written, or erased;

(b) obtaininl a circuit state value where the circuit state value is responsive to the number of sections biased;

(c) comparing the circuit state value to a reference parameter; and (d) based on the comparison of step (c), selecting for activation for a read/write/erase operation a quantity of sections.

2. The method of claim 1, further comprising:
after step (c), repeating steps (a), (b), and (c), for each repetition varying the number of sections biased in step (a).

3. The method of claim 2, wherein the number of sections biased in step (a) is increased for each repetition.

4. The method of claim 2, wherein the number of sections biased in step (a) is decreased for each repetition.

5. The method of claim 2, further comprising:
before biasing step (a), obtaining an environmental value, said environmental value indicating a condition of the memory device, where the number of sections biased in step (a) is based on the environmental value.

6. The method of claim 5, wherein the environmental value is an operating temperature.

7. The method of claim 5, wherein the environmental value is a user-selected setting.

8. The method of claim 2, wherein the number of sections biased in biasing step (a) is based on the quantity of sections read, written, or erased in a prior readlwrite/erase operation.

9. The method of claim 2, wherein the circuit state value is a voltage on the biased sections.

10. The method of claim 2, wherein the circuit state value is a current on the biased sections.

11. The method of claim 5, wherein the circuit state value is a voltage on the biased sections.

12. The method of claim 5, wherein the circuit state value is a current on the biased sections.

13. A memory device employing a method for dynamically selecting within the memory device a quantity of sections to be activated for a read/write/erase operation, said method comprising the steps of:
a) biasing a number of sections to be read, written, or erased;
b) obtaining a circuit state valu where the circuit state value is responsive to the number of sections biased;
c) comparing the circuit state value to a reference parameter; and
d) based on the comparison of step (c), selecting for activation for a read/write/erase operation a quantity of sections.

14. The device of claim 13, further comprising:
after step (c), repeating steps (a), (b), and (c), for each repetition varying the number of sections biased in step (a).

15. The device of claim 14, wherein the number of sections biased in step (a) is increased for each repetition.

16. The device of claim 14, wherein the number of sections biased in step (a) is decreased for each repetition.

17. The device of claim 14, further comprising:
before biasing step (a), obtaining an environmental value, said environmental value indicating a condition of the memory device where the number of sections biased in step (a) is based on the environmental value.

18. The device of claim 17, wherein the environmental value is an operating temperature.

19. The device of claim 17, wherein the environmental value is a user-selected setting.

20. The device of claim 14, wherein the number of sections biased in biasing step (a) is based on the quantity of sections read, written, or erased in a prior read/write/erase operation.

21. The device of claim 14, wherein the circuit state value is a voltage on the biased sections.

22. The device of claim 14, wherein the circuit state value is a current on the biased sections.

23. The device of claim 17, wherein the curcuit state value is a voltage on the biased sections.

24. The device of claim 17, wherein the circuit state value is a current on the biased sections.

* * * * *